United States Patent [19]
Nagamoto

[11] 3,943,317

[45] Mar. 9, 1976

[54] MICROWAVE OVEN POWER SUPPLY CIRCUIT

[75] Inventor: Schun-ichi Nagamoto, Nara, Japan

[73] Assignee: Matsushita Electric Industrial Company, Ltd., Osaka, Japan

[22] Filed: July 15, 1974

[21] Appl. No.: 488,683

[30] Foreign Application Priority Data
July 18, 1973  Japan.................................. 48-81796
Feb. 20, 1974  Japan.................................. 49-20803

[52] U.S. Cl............................................ 219/10.55 B
[51] Int. Cl.²....................................... H05B 9/06
[58] Field of Search .................. 219/10.55 B, 10.75; 307/293

[56] References Cited
UNITED STATES PATENTS

| | | |
|---|---|---|
| 3,546,483 | 12/1970 | Lundin.......................... 219/10.55 B |
| 3,735,237 | 5/1973 | Derby............................ 219/10.55 B |
| 3,780,252 | 12/1973 | Crapuchettes............... 219/10.55 B |
| 3,784,781 | 1/1974 | Foeustnev et al............ 219/10.55 B |
| 3,842,233 | 10/1974 | Lamb............................ 219/10.55 B |

*Primary Examiner*—Bruce A. Reynolds
*Attorney, Agent, or Firm*—Stevens, Davis, Miller & Mosher

[57] ABSTRACT

A microwave oven having a defrosting means including a bidirectional thyristor provided in a power source circuit and a control circuit for on-off controlling the thyristor, whereby microwave radiation can be intermittently irradiated on the foodstuff to obtain effective defrosting. Also, surge current at the time of start and end of the microwave oscillation is prevented.

2 Claims, 9 Drawing Figures

MICROWAVE OVEN POWER SUPPLY CIRCUIT

It is well known in the art that it is effective in cooking and defrosting foodstuff, particularly frozen foodstuff, in a microwave oven to intermittently produce microwave output.

In the prior art microwave ovens, the output is on-off switched by switching the capacitance of a high voltage capacitor or a high voltage circuit, or it is varied by using a plurality of magnetrons. In these methods, however, the output can be switched in only limited steps. Also, in case of directly switching the high voltage circuit through a switch, various inconveniences such as the generation of surge voltage and the requirement for the switch itself to have high breakdown voltage are encountered, and also high cost is required.

A first object of the invention is to permit variation of the microwave output by varying the current supply factor through on-off control at a repetition period short enough to have no substantial effect upon the heating period. In one specific form of the invention, a bidirectional thyristor is used as a switching element for on-off controlling current supply to the primary of a high voltage transformer, and the bidirectional thyristor is on-off controlled by an on-off signal produced from an electronic drive circuit consisting of a multivibrator. In the disclosed embodiments, the bidirectional thyristor is shown as a three-terminal device, one example of which is a Triac.

In another aspect, the circuit where the high voltage transformer for the microwave heater constitutes a load is prone to transient surge current, the magnitude of which is determined by (i) the phase of the power source at the time of coupling thereof and (ii) the remanence of the high voltage transformer at the time of coupling of the power source, and which is as high as several tens times the normal current at the maximum.

A second object of the invention, accordingly, is to prevent transient surge current which is produced when the on-off control of the current supply is effected by phase controlling a switching element through an electronic circuit, to thereby greatly improve the precision of control and the reliabiliity of the control circuit.

The above and other objects, features and advantages of the invention will become more apparent from the following description taken in conjunction with the accompanying drawings, in which.

Figure 1:
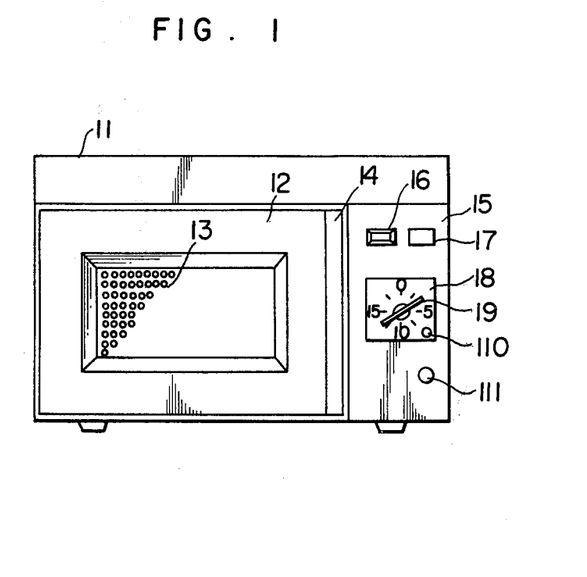
FIG. 1 is a front view of a microwave oven embodying the invention.

Referring to FIG. 1, numeral 11 designates a panel, and numeral 12 a door for loading foodstuff into and taking it out of the oven. The door 12 has a window 13 consisting of a number of small round see-through holes about 2 millimeters in diameter, so that the state of cooking of the inner foodstuff can be observed through the window 13 without causing leakage of microwave radiation. Numeral 14 designates a knob of the door. Numeral 16 designates a lamp to indicate the state of cooking. By depressing a cooking start button 17 after closing power source through a power source switch knob 19, the lamp 16 is turned on to indicate the pressence of microwave radiation. Numeral 18 designates a cooking period scale. The cooking period is set by a period setter co-operating with the power source switch knob 19. Numeral 110 designates a lamp to indicate the operation of a defrosting timer according to the invention. It is turned on by setting a select switch 111 to render the defrosting timer operative.

Figure 2:
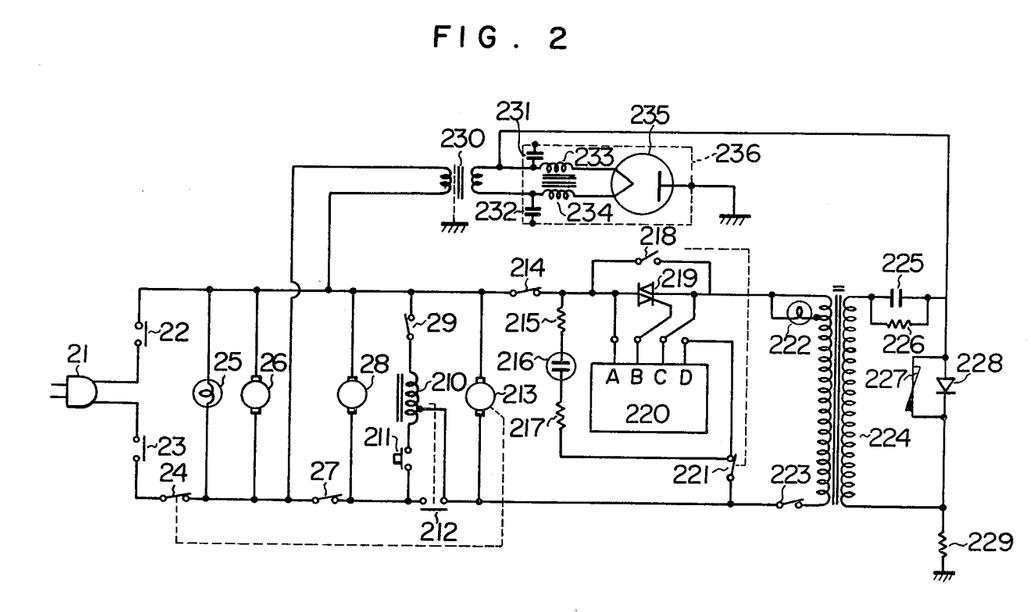
FIG. 2 is a circuit diagram of the same.

Referring to FIG. 2, numeral 21 designates a power source plug to be connected to a commercial a-c power source. Numerals 22 and 23 designate interlock switches. They are normally "on", but they are opened when an outer frame of the oven is removed by a service man for the purpose of repair. In this way, the safety is ensured. Numeral 24 designates a power source switch, and it is operated by the power source switch knob 19 shown in FIG. 1. It is also interlocked to a timer motor 213, so that at the end of cooking it is automatically switched off to disconnect the power source. Numeral 25 designates an oven lamp to illuminate the interior of the oven. Numeral 26 designates a fan motor to drive a fan for cooling electric parts such as a magnetron 235. Numeral 28 designates a stirrer motor to drive a metal stirrer blade within the oven so as to provide for uniform cooking. Numeral 27 designates a first door switch on-off operated in an interlocked relation to the opening and closing of the door 12. Numeral 29 designates a thermal switch installed on a magnetron cooler fin. It is actuated to disconnect the power source when the temperature of the magnetron is excessively raised due to such cause as a trouble in the fan motor. Numeral 210 designates a power relay coil, and numeral 212 a relay switch. Numeral 211 is a switch of the cooking start button 17 shown in FIG. 1. When this switch is turned on after closure of the power source, the power relay is activated to connect the power source to a high voltage transformer 224. Numeral 214 designates a second door switch, and it operates in the same way as the first door switch. Numerals 215 and 217 designate resistors for giving adequate voltage and current to a neon tube 216 serving as light source of the defrosting timer operation indicator lamp 110 shown in FIG. 1. Numeral 218 designates a second switch of the select switch 111 shown in FIG. 1. It has a function of shortcircuiting a bidirectional thyristor 219, and it is interlocked to a first switch 221. Numeral 220 designates an electronic control circuit referred to here as the defrosting timer circuit. It gives an actuating signal to the bidirectional thyristor 219. Numeral 223 designates a third door switch. Numeral 224 designates a high voltage transformer for stepping up the commercial power source voltage to a magnetron oscillation voltage level. Numeral 225 designates a capacitor capable of withstanding a high voltage. Numeral 228 designates a diode capable of withstanding a high reverse voltage, and it constitutes a half wave double voltage circuit together with the high voltage transformer 224. Numeral 226 is a discharging resistor in parallel with the capacitor 225, numeral 227 a varistor for cutting abnormal surge voltage and numeral 229 a resistor for checking the anode current in the magnetron 235. Numeral 230 designates a filament transformer for supplying power to the cathode of the magnetron. Numerals 231 and 232 designate capacitors, numerals 233 and 234 choke coils. They form a filter for blocking noise from the cathode side of the magnetron. Numeral 236 designates a chassis of the magnetron 235.

Figure 3:
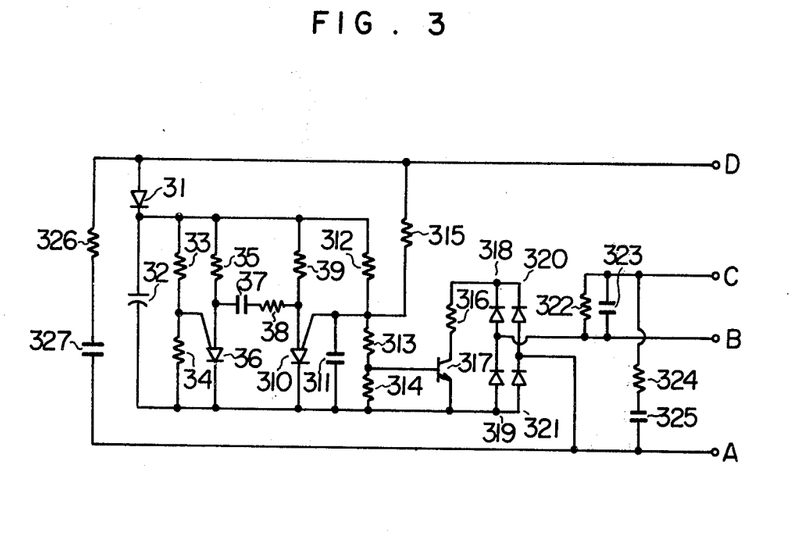
FIG. 3 is a circuit diagram of a defrosting timer circuit in the same embodiment.

FIG. 3 is a circuit diagram of the defrosting timer circuit 220 shown in FIG. 2. Here, numeral 31 designates a diode, and numeral 32 a capacitor. They serve to half-wave rectify and smooth the source voltage to supply a d-c voltage having adequate ripple component. Numerals 33 and 34 designate resistors serving to divide the afore-mentioned d-c voltage so as to couple a divided voltage between the gate and cathode of a negative or n-gate thyristor 36. Numerals 312, 313, and 314 designate resistors serving to divide the afore-said d-c voltage so as to couple a divided voltage between the gate and cathode of a negative or n-gate thyristor 310. Numerals 35 and 39 designate resistors, and numeral 37 a capacitor. They determine together with resistors 33, 34 and 312, 313 the time constant of the astable multivibrator circuit consisting of parts 33 to 315. Numeral 314 designates a resistor connected between the base and emitter of a transistor 317, numeral 315 a resistor for superimposing the source voltage upon the gate voltage on the or n-gate thyristor 310, and numeral 316 a resistor serving to restrict the collector current in the transistor 317. The output of the astable multivibrator circuit is picked up from the gate of the n-gate thyristor 310 and applied to the base of the output transistor 317 through resistor 313. Numerals 318 to 321 designate diodes constituting a diode bridge to give a half-wave rectified d-c voltage between the collector and emitter of the transistor 317. Numerals 322 and 326 designate resistors, and numerals 323 and 327 noise absorption capacitors. The series circuit of resistor 324 and capacitor 325 is in parallel with the bidirectional thyristor 219 shown in FIG. 2, assisting the inverting action of the bidirectional thyristor.

In the above circuit, the actuating signal supplied to the bidirectional thyristor can be phase controlled by the effect of superimposing the ripplecontaining d-c voltage and the source voltage provided by the resistor 315. In the instant embodiment, the "on"-start phase is set substantially to 80°, and the "on"-end phase to 260°–270°.

Figure 4:
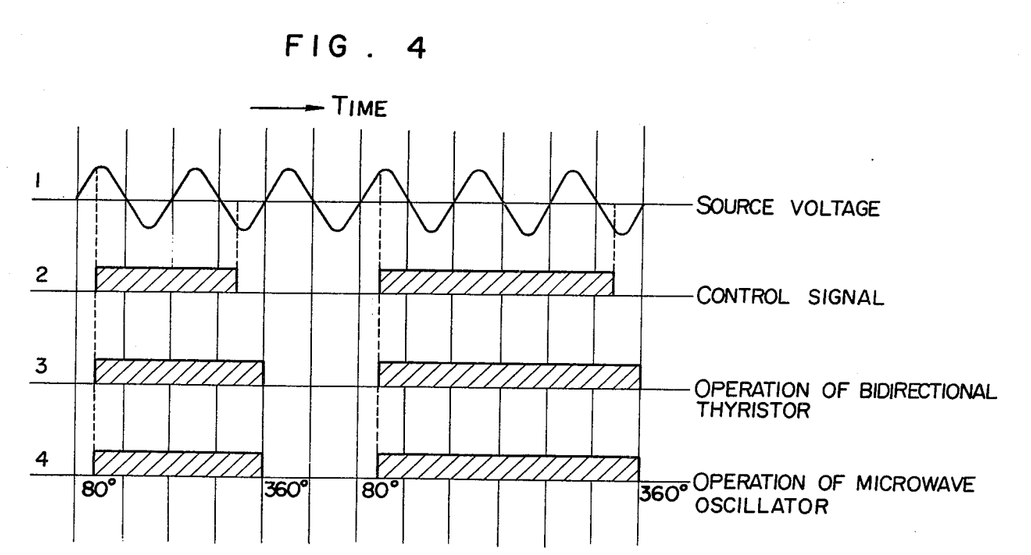
FIG. 4 is a time chart showing the phase relation in the operation of the defrosting timer.

FIG. 4 shows the phase relation in the operation of the defrosting timer. Here, indicated at 1 is the source voltage, at 2 the control signal added from the defrosting circuit shown in FIG. 3 to the gate terminal of the bidirectional thyristor, at 3 the operation of bidirectional thyristor turning on at 80° of the source voltage phase and turning off at 360°, and at 4 the operations of the microwave oscillation synchronized to the operation of the bidirectional thyristor.

Figure 5:
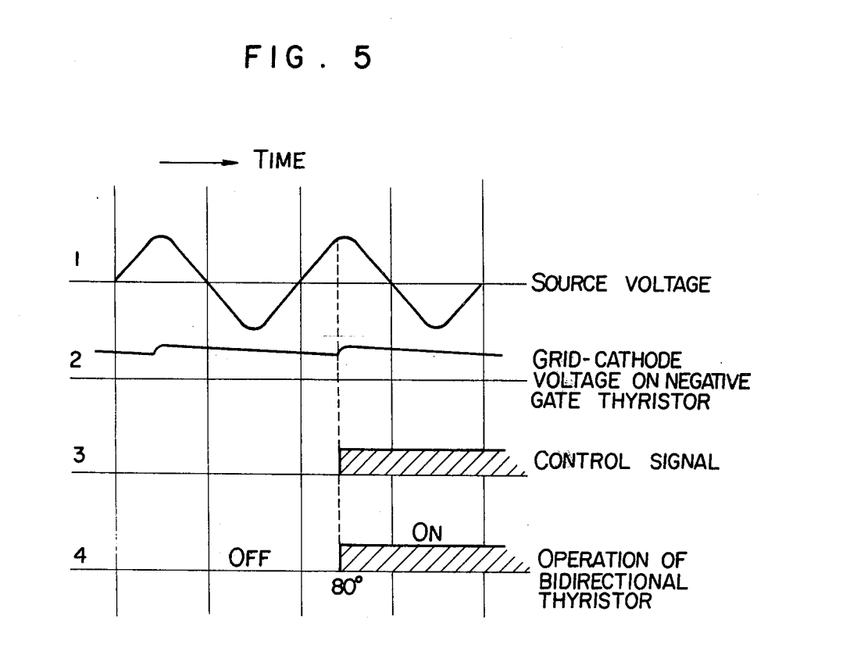
FIG. 5 is a time chart showing the phase relation when a bidirectional thyristor is turned on during the operation of the defrosting timer.

FIG. 5 shows the phase relation when the bidirectional thyristor is turned on during operation of the defrosting timer. Indicated at 1 is the source voltage, at 2 the voltage between the gate and cathode of the n-gate thyristor 36 in the defrosting circuit shown in FIG. 3, and at 3 the control signal coupled from the defrosting circuit to the bidirectional thyristor. Indicated at 4 is the operation of the bidirectional thyristor.

Figure 6:
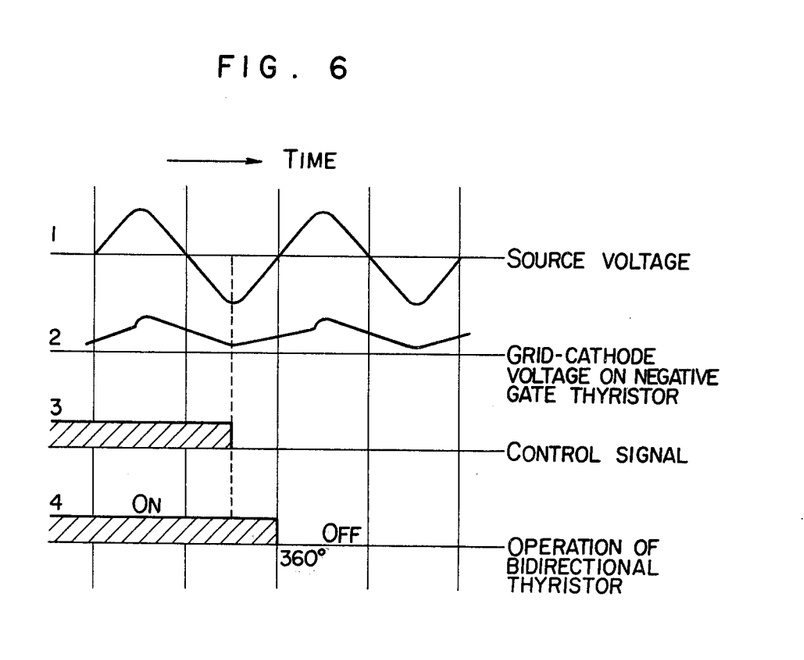
FIG. 6 is a time chart showing the phase relation when a bidirectional thyristor is turned off during the operation of the defrosting timer.

FIG. 6 shows the phase relation when the bidirectional thyristor is turned off during the operation of the defrosting timer in the "off" state thereof. Indicated at 1 is the source voltage, at 2 the voltage between the gate and cathode of the negative gate thyristor in the defrosting circuit shown in FIG. 3, and at 3 the control signal coupled from the defrosting circuit to the bidirectional thyristor. Indicated at 4 is the operation of the bidirectional thyristor.

Figure 7:
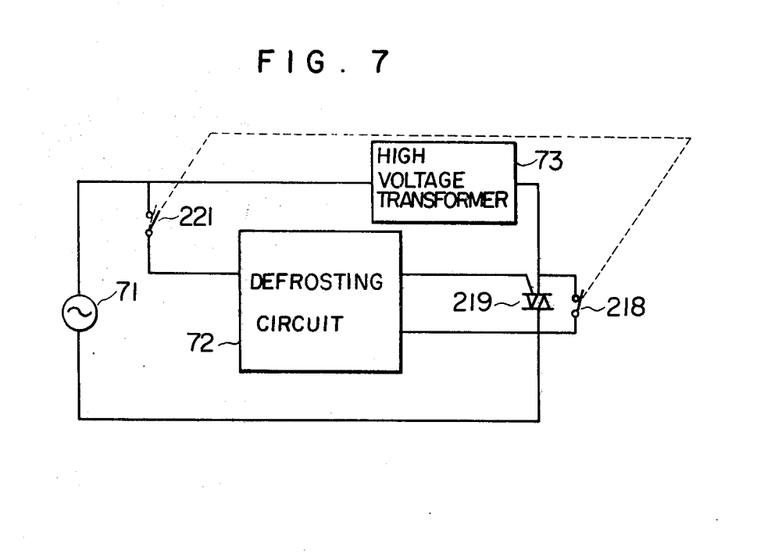
FIG. 7 is a circuit diagram illustrating the construction of a select switch for switching between the normal use of the oven and the use of the defrosting timer.

FIG. 7 shows a circuit diagram for illustrating the operation of the select switch for switching between the normal use of the oven and the use of the defrosting timer. Numeral 71 designates the power source, numeral 221 the first switch of the select switch and numeral 218 the second switch operated in an interlocked relation to the operation of the button 111 shown in FIG. 1. Numeral 72 designates the defrosting circuit shown in FIG. 3, and numeral 73 the load of the circuit including the high voltage transformer and magnetron of the oven. In the normal use of the oven, the first switch of the select switch is off while the second switch is on. Thus, in this state the defrosting circuit is inoperative and the bidirectional thyristor is short-circuited, so that the oven executes full load operation. In case of using the defrosting timer, the first switch of the select switch is closed, while the second switch is opened. In this state, the defrosting circuit is operative, giving the on-off signal to the gate of the bidirectional thyristor. Since the bidirectional thyristor is biased from the source voltage, it is on-off operated with the on-off signal from the defrosting circuit. In this case, the oven operates intermittently, that is, it operates with effectively reduced output.

Figure 8:
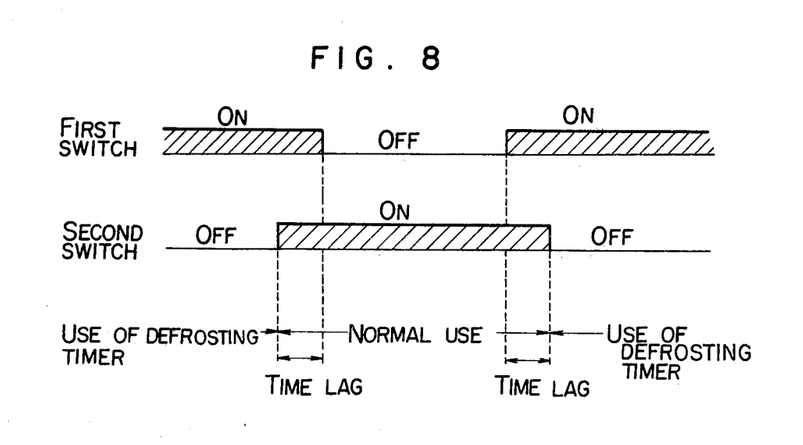
FIG. 8 is a time chart showing the operation of first and second switches of the select switch.

Now, as shown in FIG. 8, there is provided a certain time lag between the first and second switches of the select switch. This is made so for the purpose of preventing the malfunctioning of the bidirectional thyristor due to the transient state of the defrosting circuit. More particularly, the bidirectional thyristor is given voltage only while the defrosting circuit is in the steady operative state, and it is short-circuited and not biased with any voltage at the time of the transient state of the defrosting circuit.

The malfunctioning of the bidirectional thyristor would result in the transient state of the defrosting circuit because the trigger sensitivity of the bidirectional thyristor differs with the polarity of the voltage impressed. If a trigger signal from the defrosting circuit is less due to the transient state thereof, the bidirectional thyristor often remains off in case the trigger signal is negative, although it is triggered, in case of the positive polarity. In the former case, the bidirectional thyristor acts as a diode, so that the half-wave rectified d-c voltage will be added to the high voltage transformer in FIG. 2, giving rise to saturation current which is as large as several ten times the normal current.

For this reason, the first and second switches of the select switch are made to operate in the manner as shown in FIG. 8.

Figure 9:
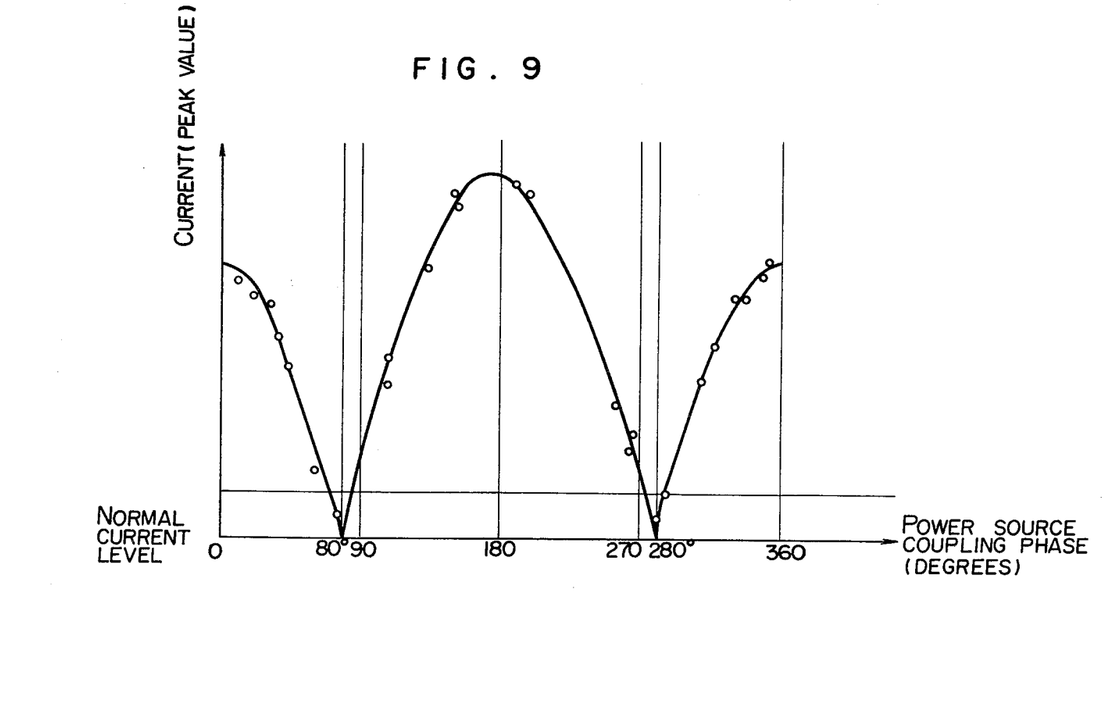
FIG. 9 is a graph showing the correlation between surge current and phase of coupling of power source.

FIG. 9 shows the experimentarily obtained correlation between transient surge current and power source coupling phase at a certain constant value of the remanence of the high voltage transformer. This indicates that by effecting the coupling of the power source under a constant remanence condition it is possible to suppress the surge current to be zero or below the normal current.

In the experiments the remanence was set constant by so arranging as to end the current supply to the high voltage transformer at the phase of 360°. At this time, the optimum phase of coupling of the power source was in the vicinity of 80° or 280°.

What we claim is:

1. A microwave oven power supply circuit, comprising:
   a microwave oscillator;
   an A.C. source;
   a high voltage transformer having a primary winding coupled to said A.C. source and a secondary winding coupled to said microwave oscillator;
   a bidirectional thyristor coupled between said primary winding and said A.C. source; and
   a control circuit coupled to a gate electrode of said bidirectional thyristor for controlling the ON-OFF switching of said thyristor to thereby control the flow of current between said A.C. source and said transformer primary, said control circuit including:
      a rectifying circuit coupled to said A.C. source for rectifying and smoothing the A.C. source voltage to obtain a ripple-containing D.C. voltage as its output,
      a negative gate thyristor astable multivibrator circuit coupled to and controlled by the output of said rectifying circuit,
      a transistor circuit coupled to said astable multivibrator and to said A.C. source for superimposing said ripple-containing D.C. voltage onto said A.C. source voltage, and
      means coupling the output of said transistor circuit to said bidirectional thyristor gate electrode to turn said thyristor on at a phase angle of approximately 80° relative to said A.C. source.

2. A microwave oven power supply circuit according to claim 1, further comprising: first switching means for connecting said A.C. source through said control circuit when closed; and second switching means for short-circuiting said thyristor when closed; said first and second switching means being interlocked such that said second switch means is opened only after said first switch means has closed for a time sufficient to permit said control circuit to reach its steady state operation.

* * * * *